(12) United States Patent
Wang et al.

(10) Patent No.: US 10,872,547 B2
(45) Date of Patent: Dec. 22, 2020

(54) GATE DRIVER AND DISPLAY APPARATUS THEREOF

(71) Applicant: Century Technology (Shenzhen) Corporation Limited, Shenzhen (CN)

(72) Inventors: Hui Wang, Shenzhen (CN); Ning Fang, Shenzhen (CN); Chih-Chung Liu, New Taipei (TW); Ming-Tsung Wang, New Taipei (TW); Meng-Chieh Tai, New Taipei (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 160 days.

(21) Appl. No.: 16/170,513

(22) Filed: Oct. 25, 2018

(65) Prior Publication Data

US 2020/0027382 A1 Jan. 23, 2020

(30) Foreign Application Priority Data

Jul. 20, 2018 (CN) .......................... 2018 1 0805655

(51) Int. Cl.
*G11C 19/00* (2006.01)
*G09G 3/20* (2006.01)
*G11C 19/28* (2006.01)
*G09G 3/36* (2006.01)

(52) U.S. Cl.
CPC ............. *G09G 3/20* (2013.01); *G09G 3/3677* (2013.01); *G11C 19/28* (2013.01); *G09G 2310/0267* (2013.01); *G09G 2310/0286* (2013.01); *G09G 2310/0289* (2013.01); *G09G 2310/08* (2013.01)

(58) Field of Classification Search
None
See application file for complete search history.

(56) References Cited

U.S. PATENT DOCUMENTS

| 9,218,779 | B2* | 12/2015 | Kim ..................... G09G 3/3696 |
| 10,037,741 | B2* | 7/2018 | Wang ................... G09G 3/3688 |
| 10,217,391 | B2* | 2/2019 | Shang ....................... G09G 3/20 |
| 2006/0290390 | A1* | 12/2006 | Jang ......................... G11C 19/28 |
| | | | 327/112 |
| 2008/0116944 | A1* | 5/2008 | Tobita .................... G11C 19/28 |
| | | | 327/142 |
| 2009/0256794 | A1* | 10/2009 | Jang ....................... G11C 19/28 |
| | | | 345/100 |

(Continued)

*Primary Examiner* — Tuan T Lam
(74) *Attorney, Agent, or Firm* — ScienBiziP, P.C.

(57) ABSTRACT

A gate driver with reduced voltage fluctuations driving a display device generates pulse signals shifted in a specified phase. The gate driver includes connected unit circuits. Each unit circuit includes an output terminal, input and output transistors, and a holding module. First and second control signals, alternating oppositely between high and low states, govern the two transistors. The input transistor is controlled by a first control signal and outputs a high level voltage to a first node based on a trigger signal. The output transistor outputs the shifted pulse signal synchronously with a clock control signal, based on the high level voltage of the first node. Initially, the trigger signal is low and the first and second control signals are high. The holding module outputs the low level voltage to the output terminal based on the first control signal and the second control signal.

16 Claims, 6 Drawing Sheets

(56) References Cited

U.S. PATENT DOCUMENTS

2014/0010341 A1* 1/2014 Wu ................. G11C 19/00
                                                377/78
2017/0270851 A1* 9/2017 Shang ............... G11C 19/28
2019/0213970 A1* 7/2019 Wang ................ G09G 3/20

* cited by examiner

GATE DRIVER AND DISPLAY APPARATUS THEREOF

FIELD

The present disclosure relates to displays driven by gate driver.

BACKGROUND

Display apparatuses can include a plurality of scan lines and a plurality of data lines. The scan lines are crossed with data lines to define a plurality of pixel units. The display apparatus further includes a gate driver for driving the scan lines, a source driver for driving the data lines, and a time controller for driving the gate driver and the source driver. The gate driver includes unit circuits connected in multiple stages. Each unit circuit receives a clock control signal, a set signal, and a reset signal, and outputs a pulse signal as the scanning signal to one of the scan lines. Each unit circuit includes several transistors, a driving transistor, and at least one capacitor. The at least one capacitor is electrically connected between a drain electrode and a source electrode of the driving transistor. The driving transistor being turned on outputs a signal synchronous with the clock signal as the scanning signal. During a power-on period, the clock signals provided to the gate driver need to be high level voltage for initializing the gate driver, and the transistors and the driving transistor in each shift register are turned on, which causes threshold voltages of the transistor and the driving transistor to increase.

Thus, there is room for improvement in the art for the stability of the display apparatus.

BRIEF DESCRIPTION OF THE FIGURES

Implementations of the present disclosure will now be described, by way of example only, with reference to the attached figures.

DETAILED DESCRIPTION

Figure 1:
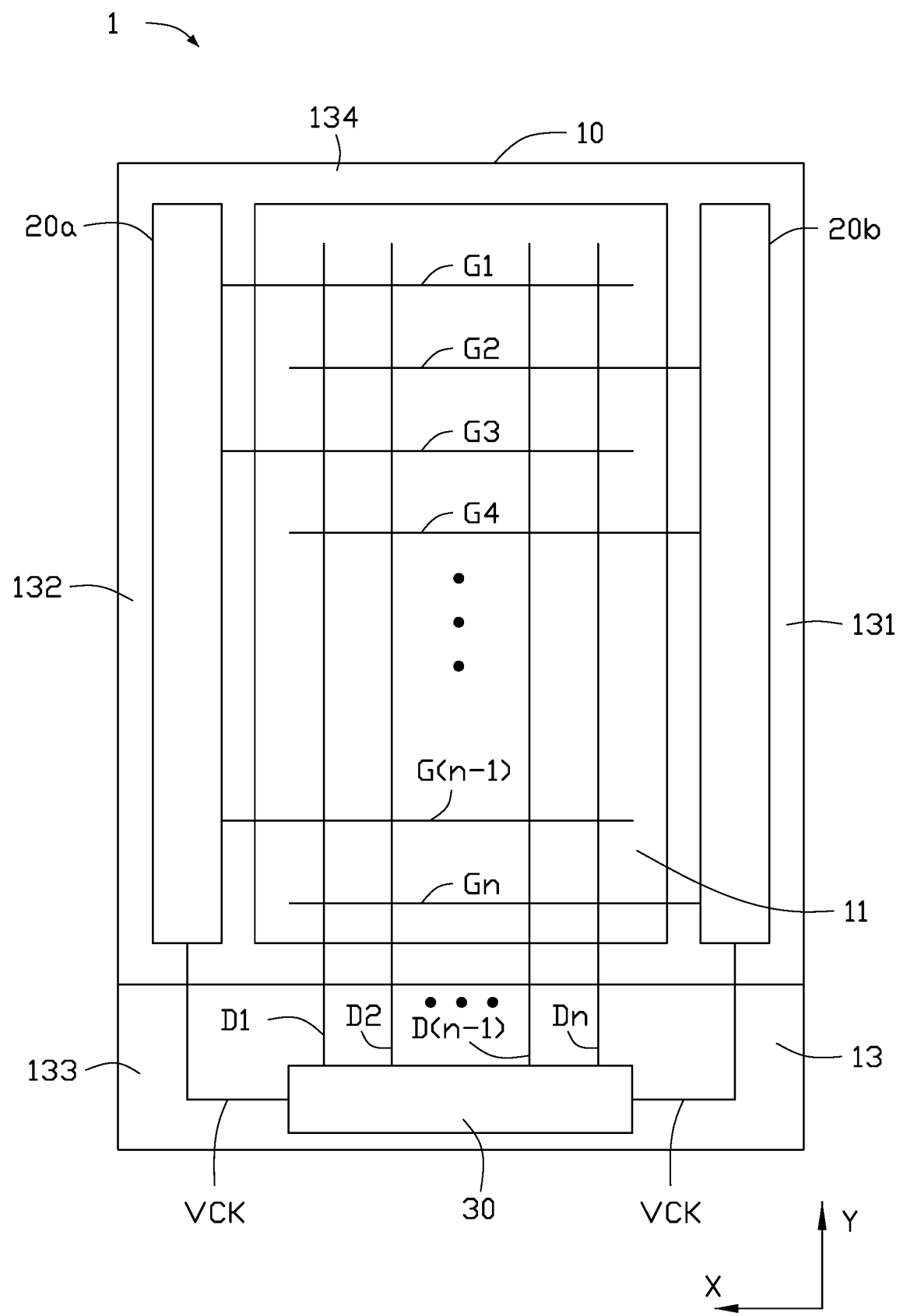
FIG. 1 is a diagram showing an embodiment of a display apparatus; the display apparatus includes a gate driver with a shift register.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "comprising" means "including, but not necessarily limited to"; it specifically indicates open-ended inclusion or membership in a so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one." The term "circuit" is defined as an integrated circuit (IC) with a plurality of electric elements, such as capacitors, resistors, amplifiers, and the like.

The present disclosure provides a gate driver. The gate driver is capable of generating pulse signals which have been shifted in a specified phase. The gate driver includes many unit circuits connected in multiple stages. Each unit circuit receives at least one external clock control signal and operates under an initial period and then an operation period. Each unit circuit comprises an output terminal, an input transistor, an output transistor, and a holding module. The output terminal is electrically connected with at least one external signal line, and provides the shifted pulse signal to the external signal line. The shifted pulse signal of the (N+1)th unit circuit outputted to the (N+1)th signal line is shifted by the specified phase with the shifted pulse signal of the Nth unit circuit outputted to the Nth signal line. The input transistor outputs a high level voltage to a first node based on a trigger signal, which activates the current unit circuit. A gate electrode of the output transistor is electrically connected with the first node, a source electrode of the output transistor receives the clock control signal, and a drain electrode of the output transistor is electrically connected with the output terminal. The output transistor outputs the shifted pulse signal through the output terminal, which is synchronous with the clock control signal, based on the high level voltage of the first node. The holding module receives the trigger signal, a first control signal, and a second control signal. During the initial period, the unit circuit is unable to output the shifted pulse signal. During the operation period, the unit circuit outputs the shifted pulse signal. During the initial period, the trigger signal is at a low level voltage, and the first control signal and the second control signal are at a high level voltage, and the holding module outputs the low level voltage to the output terminal.

In an embodiment, during the operation period, each of the first control signal and the second control signal switches between the low level voltage and the high level voltage. The first control signal and the second control signal alternate at the high level voltage. In any point in time, voltages of the first control signal and the second control signal are different. When the trigger signal is at the low level voltage, the third electrode of the holding module outputs the low level voltage to the output terminal.

In an embodiment, the holding module comprises a control unit, a first switching unit, and a second switching unit. The control unit comprises the first input terminal, a second input terminal connected with the first node, the first control terminal, the second control terminal, and a second node connected with the first switching unit and the second switching unit. The second node is at the high level voltage based on the trigger signal at the low level voltage. The first switching unit and the second switching unit alternately output the low level voltage to the output terminal.

In an embodiment, the first switching unit outputs the low level signal based on the first control signal at the high level voltage. The second switching unit outputs the low level voltage based on the second control signal at the high level voltage.

In an embodiment, the control unit comprises five transistors, first to fifth transistors. A gate electrode of the first transistor receives the trigger signal, a source electrode of the first transistor connects to a low voltage power source, and a drain electrode of the first transistor connects to source electrode of the third transistor. A gate electrode of the second transistor connects to the first node, a source electrode of the second transistor connects to the low voltage power source, and a drain electrode of the second transistor connects to the second node. A gate electrode of the third transistor connects to the drain electrode of the first transistor, a source electrode of the third transistor connects to the gate electrode of the third transistor, and a drain electrode of the third transistor connects to the second node. A gate electrode of the fourth transistor connects to the first control terminal, a source electrode of the fourth transistor connects to the gate electrode of the fourth transistor, and a drain electrode of the fourth transistor connects to the drain electrode of the first transistor. A gate electrode of the fifth transistor connects to the second control terminal, a source electrode of the fifth transistor connects to the gate electrode of the fifth transistor, and a drain electrode of the fifth transistor connects to the drain electrode of the first transistor.

In an embodiment, the first switching unit comprises four transistors, sixth to ninth transistors. A gate electrode of the sixth transistor connects to the first control terminal, a source electrode of the sixth transistor connects to the second node, and a drain electrode of the sixth transistor connects to the gate electrode of the seventh transistor through a third node. A source electrode of the seventh transistor connects to the low voltage power source, and a gate electrode of the seventh transistor connects to the second control terminal. Gate electrodes of the eighth transistor and the ninth transistor connect to the third node, source electrodes of the eighth transistor and the ninth transistor connect to the low voltage power source, a drain electrode of the eighth transistor connects to the first node, and a drain electrode of the ninth transistor connects to output terminal.

In an embodiment, the second switching unit comprises four transistors, tenth to thirteenth transistors. A gate electrode of the tenth transistor connects to the second control terminal, a source electrode of the tenth transistor connects to the second node, and a drain electrode of the tenth transistor connects to the gate electrode of the eleventh transistor through a fourth node. A source electrode of the eleventh transistor connects to the low voltage power source, and a gate electrode of the eleventh transistor connects to the first control terminal. Gate electrodes of the twelfth transistor and the thirteenth transistor connect to the third node, source electrodes of the twelfth transistor and the thirteenth transistor connect to the low voltage power source, a drain electrode of the twelfth transistor connects to the first node, and a drain electrode of the thirteenth transistor connects to output terminal.

In an embodiment, the unit circuit further comprises a pull-down transistor. Gate electrode of the pull-down transistor receives a reset signal, a source electrode of the pull-down transistor is electrically connected to the low voltage power source, and a drain electrode of the pull-down transistor is electrically connected to the first node.

In an embodiment, during the operation period, voltages of the first control signal and the second control signal invert every 8 frame periods.

A display defines a display region and a non-display region surrounding the display region. The non-display region includes at least one gate driver. The at least gate driver generates pulse signals shifted in a specified phase. The at least gate driver includes unit circuits connected in multiple stages. Each unit circuit receives an external clock control signal and sequentially operates under an initial period and an operation period. Each unit circuit comprises an output terminal, an input transistor, an output transistor, and a holding module. The output terminal is electrically connected with at least one external signal line, and provides the shifted pulse signal to the external signal line. The shifted pulse signal of the (N+1)th unit circuit outputted to the (N+1)th signal line is shifted by the specified phase with the shifted pulse signal of the Nth unit circuit outputted to the Nth signal line. The input transistor outputs a high level voltage to a first node based on a trigger signal, which activates the current unit circuit. A gate electrode of the output transistor is electrically connected with the first node, a source electrode of the output transistor receives the clock control signal, and a drain electrode of the output transistor is electrically connected with the output terminal. The output transistor outputs the shifted pulse signal through the output terminal, which is synchronous with the clock control signal, based on the high level voltage of the first node. The holding module receives the trigger signal, a first control signal, and a second control signal. During the initial period, the unit circuit is unable to output the shifted pulse signal. During the operation period, the unit circuit outputs the shifted pulse signal. During the initial period, the trigger signal is at a low level voltage, and the first control signal and the second control signal are at a high level voltage. The holding module outputs the low level voltage to the output terminal.

Figure 2:
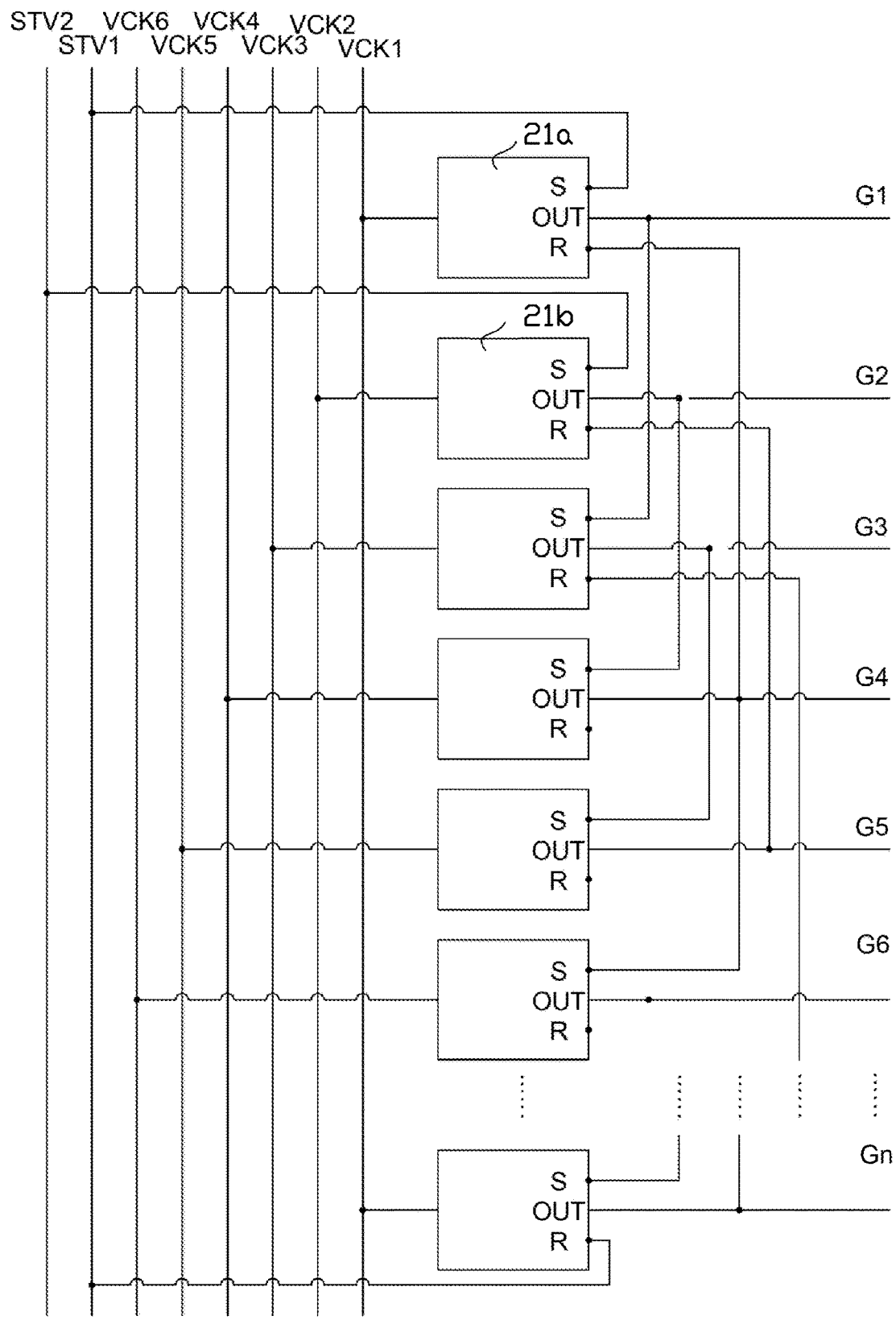
FIG. 2 is a diagram showing the gate driver of the display apparatus in FIG. 1, the shift register includes a plurality of unit circuits.

FIG. 1 illustrates an embodiment of the display apparatus 1. The display apparatus 1 defines a display region 11 and a non-display region 13 surrounding the display region 11. The display region 11 includes a plurality of scan lines G1-Gn and a plurality of data lines D1-Dm. In the present embodiment, n is an even integer and m is positive integer, each larger than 2. The scan lines G1-Gn are parallel with each along a first direction X, and the data lines D1-Dm are parallel with each other along a second direction Y, Y being perpendicular to X. The scan lines G1-Gn and the data lines D1-Dm are arranged as a grid to define pixel units 10 at each line crossing. A particular design of a display device can angle scan lines G1-Gn across data lines D1-Dm, but the orientation of the lines is not limited to such orientation. The non-display region 13 includes at least one gate driver 20 and a source driver 30. In the present embodiment, the non-display region 13 includes two gate drivers 20a/20b. The non-display region defines a first edge 131, a second edge 132 parallel to the first edge 131, a third edge 133 perpendicular to the first edge 131, and a fourth edge 134 parallel to the third edge 133. The first edge 131 and the second edge 132 are symmetrically disposed on opposite sides of the display region 11. The third edge 133 and the fourth edge 134 are symmetrically disposed on opposite sides of the display region 11. One of the gate drivers 20a/20b is electrically connected to the even scan lines G2, G4, . . . , Gn for driving the even scan lines G2, G4, . . . , Gn, and the other of the gate drivers 20a/20b is electrically connected to the odd scan lines G1, G3, . . . , G(n−1) for driving the odd scan lines G1, G3, . . . , G(n−1). The source driver 30 is electrically connected to the data lines D1-Dm for outputting data signals to the data lines. In other embodiments, the non-display region 13 can include one gate driver 20. The non-display region can further include a time controller (not shown) in the non-display region 13. The time controller provides controls signals and at least one clock control signal to the gate driver 20a/20b and the source driver 30. In the present embodiment, the time controller provides clock control signals through the clock control lines VCK1-VCK6 (as shown in FIG. 2) to the gate driver 20a/20b. The clock control signals from the clock control lines VCK1-VCK6 are pulse signals. The pulse signals of the clock control signals from the clock control lines VCK1-VCK6 are sequentially shifted in a specified phase. The various control signals may include a vertical synchronization (Vsync) signal, a horizontal synchronization (Hsync) signal, and a data enable (DE) signal, but are not limited thereto. Each pixel unit 10 is electrically connected to the gate driver 20 through one of the scan lines G1-Gn, and is electrically connected to the source driver 30 through one of the data lines D1-Dm.

Figure 3:
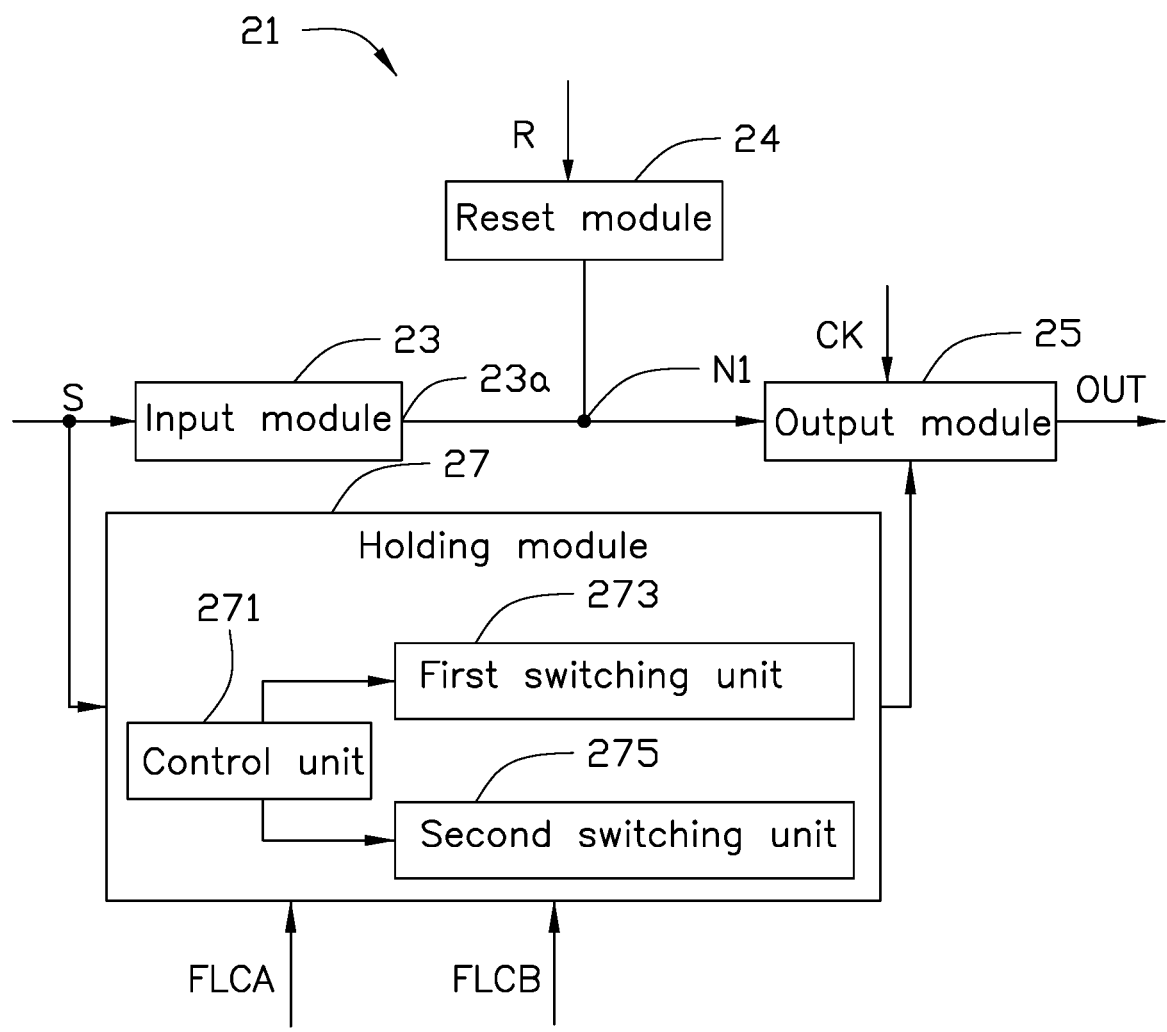
FIG. 3 is a diagram showing the unit circuit in FIG. 2, the unit circuit includes a second node.

FIGS. 2 and 3 show the gate driver 20a. The gate driver 20a generates pulse signals shifted in a specified phase, and includes unit circuits 21 connected in multiple stages. The gate driver 20 is electrically connected with the clock control lines VCK1-VCK6, and receives a first start pulse signal STV1 and a second start pulse signal STV2. Each unit circuit 21 is electrically connected to one scan line of the scan lines G1-Gn for providing the scanning signals to the scan lines G1-Gn based on one of the clock control signals of the clock control lines VCK1-VCK6. Each unit circuit 21 has a same electrical structure, and includes same terminals. Each unit circuit 21 includes a trigger terminal S, a reset terminal R, and an output terminal OUT. The trigger terminal of the first unit circuit 21a is electrically connected to the first start pulse signal STV1, and the reset terminal R of the first unit circuit 21 is electrically connected to the output terminal OUT of the second unit circuit 21b. The trigger terminal of the second unit circuit 21 is electrically connected to the second start pulse signal STV2, and the reset terminal of the second unit circuit 21 is electrically connected to the output terminal OUT of the third unit circuit 21. The trigger terminal of the third unit circuit 21 is electrically connected to the output terminal of the first unit circuit 21, and the reset terminal of the first unit circuit 21 is electrically connected to the output terminal OUT of the fourth unit circuit 21. The trigger terminal of the Nth unit circuit 21 is electrically connected to the output terminal of the (N−1)th unit circuit 21, and the reset terminal of the Nth unit circuit 21 is electrically connected to the output terminal OUT of the (N+1)th unit circuit 21.

Figure 5:
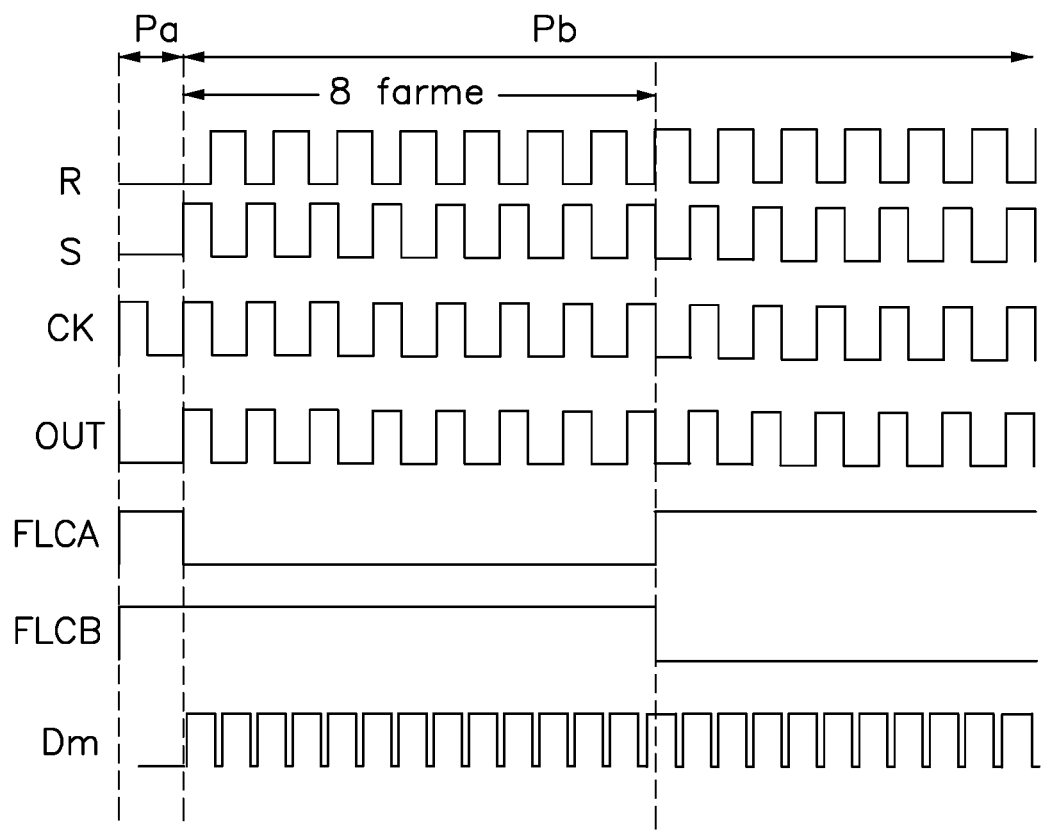
FIG. 5 is a timing chart showing waveforms of the shift register of the display apparatus in FIG. 4.

Each unit circuit 21 sequentially operates under an initial period Pa (as shown in FIG. 5) and an operation period Pb (as shown in FIG. 5). During the initial period Pa, the unit circuit 21 is unable to output the shifted pulse signal and outputs a low level voltage. During the operation period Pb, the unit circuit 21 outputs the shifted pulse signal. In this present disclosure, the initial period can include at least one state as follows.

First, the initial period Pa is a power-on period.

Second, the initial period Pa is a blank period between a frame period for displaying an image and a second frame period for displaying a subsequent image.

In the present disclosure, the initial period Pa is the power-on period.

Each unit circuit 21 further includes a clock control terminal CK, a first control terminal FLCA, and a second control terminal FLCB. The unit circuit 21 includes a flip-flop circuit, and controls the output terminal OUT based on signals of the set terminal S and the reset terminal R. When the signal of the set terminal S is effective (such as a high level voltage) and the signal of the reset terminal R is ineffective (such as a low level voltage), the output terminal OUT of the unit circuit 21 outputs the high level voltage. In the present embodiment, the high level voltage can be 20 volt (V), and the low level voltage can be −10V. When the signal of the set terminal S is ineffective and the signal of the reset terminal R is effective, the output terminal OUT of the unit circuit 21 outputs the low level voltage. The signal of the clock control input terminal CK controls a pulse width of the signal of the output terminal OUT.

The unit circuit 21 includes an input module 23 with the set terminal S, a reset module 24 with the reset terminal R, an output module 25 with the clock control terminal CK and the output terminal OUT, and a holding module 27.

Figure 4:
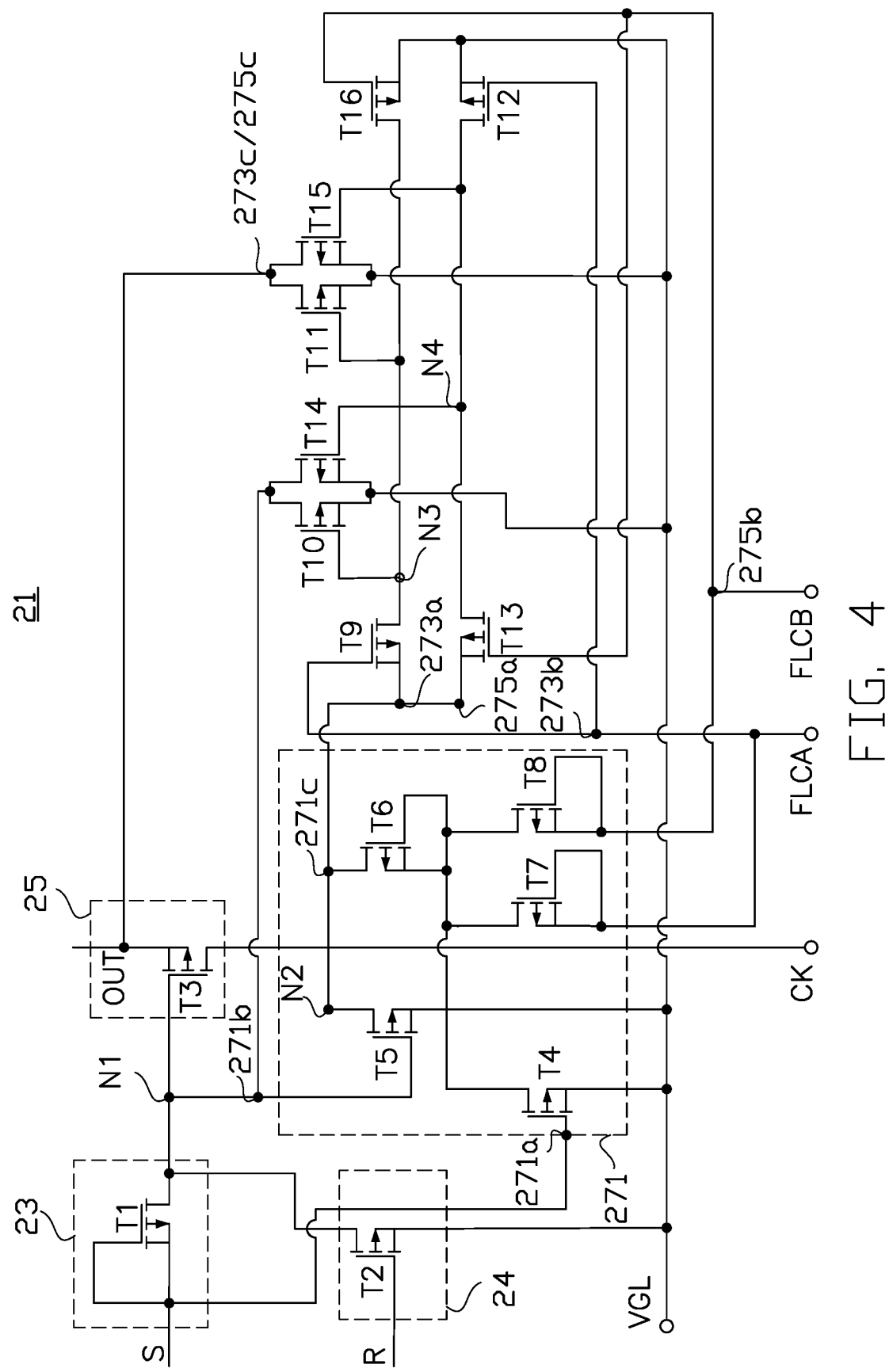
FIG. 4 is a circuit diagram showing a unit circuit in FIG. 3.

Referring to FIG. 4, the input module 23 includes the set terminal S for receiving the trigger signal. The input module 23 further includes an input transistor T1. A gate electrode of the input transistor T1 is electrically connected to the set terminal S for receiving the trigger signal, a source electrode of the input transistor T1 is electrically connected to the gate electrode of the input transistor T1, and a drain electrode of the input transistor T1 is electrically connected to the output module 25 through a first node N1. The input module 23 controls an output period of the trigger signal of the set terminal S to the output module 25. The trigger signal of the set terminal S of the Nth unit circuit 21 is the shifted pulse signal outputted by the output terminal OUT of the (N−1)th unit circuit 21.

The output module 25 controls the output terminal OUT to output the shifted pulse signal, which is synchronous with the clock signal of the clock control input terminal CK, based on the received signals of the set terminal S and the reset terminal R. The output module 25 includes an output transistor T3. A gate electrode of the output transistor T3 is electrically connected to the drain electrode of the input transistor T1 at a first node N1. A drain electrode of the output transistor T3 is electrically connected with the clock control input terminal CK, and a source electrode of the output transistor T3 is electrically connected to the output terminal OUT.

The reset module 24 controls the output terminal OUT of the current unit circuit 21 to stop outputting the shifted pulse signal based on the resetting signal of the reset terminal R. The resetting signal of the reset terminal R of the Nth unit circuit 21 is the shifted pulse signal outputted by the output terminal OUT of the (N+1)th unit circuit 21. The reset module 24 includes a pull-down transistor T2. A gate electrode of the pull-down transistor T2 is electrically connected to the reset terminal R, a source electrode of the pull-down transistor T2 is electrically connected to a low voltage power source VGL, and a drain electrode of the pull-down transistor T2 is electrically connected to the first node N1.

Referring to FIGS. 4 and 5, the holding module 27 controls the output terminal OUT of the current unit circuit 21 to be the low level voltage based on the first control signal of the first control terminal FLCA and the second control signal of the second control terminal FLCB during the initial period Pa. The holding module 27 further controls the output terminal OUT of the current unit circuit 21 to be the low level voltage based on the first control signal of the first control terminal FLCA and the second control signal of the second control terminal FLCB during the second node N2 at the high level voltage of the operation period Pb. During the initial period Pa, the first control signal of the first control terminal FLCA and the second control signal of the second control terminal FLCB are at high level voltage, and the trigger signal and the reset signal are at low level voltage. The output terminal OUT of the unit circuit 21 outputs the low level voltage based on the first control signal of the first control terminal FLCA and the second control signal of the second control terminal FLCB. During the operation period Pb, the first control signal of the first control terminal FLCA and the second control signal of the second control terminal FLCB are alternately at high level voltage. In any time point, voltages of the first control signal of the first control terminal FLCA and the second control signal of the second control terminal FLCB are different from each other. The voltages of the first control signal of the first control terminal FLCA and the second control signal of the second control terminal FLCB invert in every 8 frame periods. For example, during the first to eighth frame periods, the first control signal of the first control terminal FLCA is at the low level voltage, and the second control signal of the second control terminal FLCB is at the high level voltage. During the ninth to sixteenth frame periods, the first control signal of the first control terminal FLCA is at the high level voltage, and the second control signal of the second control terminal FLCB is at the low level voltage.

Referring to FIGS. 4 and 5, the holding module 27 includes a control unit 271, a first switching unit 273, and a second switching unit 275.

The control unit 271 includes a first input terminal 271a connected with the set terminal S, a second input terminal 271b connected with the first node N1, a first control terminal FLCA receiving the first control signal, a second control terminal FLCB receiving the second control signal, and a second node N2 as a first sub-output terminal 271c. During the initial period Pa, the first control signal and the second control signal are at high level voltage, and the trigger signal and the reset signal are at low level voltage. The first sub-output terminal 271c outputs the high level voltage to the first switching unit 273 and the second switching unit 275 based on the first control signal from the first control terminal FLCA and the second control signal from the second control terminal FLCB.

Referring to FIG. 4, the control unit 271 includes a first transistor T4, a second transistor T5, a third transistor T6, a fourth transistor T7, and a fifth transistor T8. A gate electrode of the first transistor T4 receives the trigger signal, a source electrode of the first transistor T4 connects to a low voltage power source VGL, and a drain electrode of the first transistor T4 connects to a source electrode of the third transistor T6. A gate electrode of the second transistor T5 connects to the first node N1, a source electrode of the second transistor T5 connects to the low voltage power source VGL, and a drain electrode of the second transistor T5 connects to the second node N2. A gate electrode of the third transistor T6 connects to the drain electrode of the first transistor T4, a source electrode of the third transistor T6 connects to the gate electrode of the third transistor T6, and a drain electrode of the third transistor T6 connects to the second node N2. A gate electrode of the fourth transistor T7 connects to the first control terminal FLCA, a source electrode of the fourth transistor T7 connects to the gate electrode of the fourth transistor T7, and a drain electrode of the fourth transistor T7 connects to the drain electrode of the first transistor T4. A gate electrode of the fifth transistor T8 connects to the second control terminal FLCB, a source electrode of the fifth transistor T8 connects to the gate electrode of the fifth transistor T8, and a drain electrode of the fifth transistor T8 connects to the drain electrode of the first transistor T4.

The first switching unit 273 includes a third input terminal 273a connected with the sub-output terminal 271c, a fourth input terminal 273b connected with the first control terminal FLCA, and a second sub-output terminal 273c connected with the output terminal OUT. During the initial period Pa, the second sub-output terminal 273c outputs the low level voltage to the output terminal OUT based on the first control signal of the first control terminal FLCA at the high level voltage. During the operation period Pb, the second sub-output terminal 273c outputs the low level voltage through the outputs the low level voltage to the output terminal OUT based on the first control signal of the first control terminal FLCA at the high level voltage.

The first switching unit 273 includes a sixth transistor T9, a seventh transistor T10, an eighth transistor T11, and a ninth transistor T12. A gate electrode of the sixth transistor T9 connects to the first control terminal FLCA, a source electrode of the sixth transistor T9 connects to the second node N2, and a drain electrode of the sixth transistor T9 connects to the gate electrode of the seventh transistor T10 through a third node N3. A source electrode of the seventh transistor T10 connects to the low voltage power source VGL, and a drain electrode of the seventh transistor T10 connects to the first node N1. A gate electrode of the eighth transistor T11 and the ninth transistor T12 arc is electrically connected to the third node, source electrodes of the eighth transistor T11 and the ninth transistor T12 are electrically connected to the low voltage power source VGL, a drain electrode of the eighth transistor T11 connects to the output terminal OUT, and a drain electrode of the ninth transistor T12 connects to the second switching unit 275 through a fourth node N4. A gate electrode of the ninth transistor T12 connects to the first control terminal FLCA.

The second switching unit 275 includes a fifth input terminal 275a connected with the sub-output terminal 271c, a sixth input terminal 275b connected with the first control terminal FLCA, and a third sub-output terminal 275c connected with the output terminal OUT. During the initial period Pa, the third sub-output terminal 275c outputs the low level voltage to the output terminal OUT based on the second control signal of the second control terminal FLCB at the high level voltage. During the operation period Pb, the third sub-output terminal 275c outputs the low level voltage through the outputs the low level voltage to the output terminal OUT based on the second control signal of the second control terminal FLCB at the high level voltage.

The second switching unit 275 includes a tenth transistor T13, an eleventh transistor T14, a twelfth transistor T15, and a thirteenth transistor T16. A gate electrode of the tenth transistor T13 connects to the second control terminal FLCB, a source electrode of the tenth transistor T13 connects to the second node N2, and a drain electrode of the tenth transistor T13 connects to the gate electrode of the eleventh transistor T14 through the fourth node N4. A source electrode of the eleventh transistor T14 connects to the low voltage power source VGL, and a drain electrode of the eleventh transistor T14 connects to the first node N1. A gate electrode of the twelfth transistor T15 is electrically connected to the fourth node N4, source electrodes of the twelfth transistor T15 and the thirteenth transistor T16 are electrically connected to the low voltage power source VGL, a drain electrode of the twelfth transistor T15 connects to the output terminal OUT, and a drain electrode of the thirteenth transistor T16 connects to the third node N3. A gate electrode of the thirteenth transistor T16 connects to the second control terminal FLCB.

FIG. 5 illustrates a timing chart of waveforms of the Nth unit circuit 21. The operation of the Nth unit circuit 21 is as follows.

Referring to FIGS. 4 and 5, the signal of the set terminal S and the reset terminal R is at the low level voltage, and the first control signal of the first control terminal FLCA and the second control signal of the second control terminal FLCB are at the high level voltage. The Nth unit circuit 21 is operating in the initial period Pa. During the initial period Pa, the input transistor T1 and the pull-down transistor T2 are off. The first node N1 is at low level voltage, and the output transistor T3 turns off. The first transistor T4 and the second transistor T5 turn off. Based on the first control signal of the first control terminal FLCA and the second control signal of the second control terminal FLCB, the third transistor T6, the fourth transistor T7, and the fifth transistor T8 turn on, and the second node N2 is at high level voltage. The sixth transistor T9 and the tenth transistor T13 turn on based on the high level voltage of the second node N2, and the third node N3 is at high level voltage. The seventh transistor T10 and the eleventh transistor T14 turn on based on the high level voltage of the third node N3. The voltage of the first node N1 is held at low level voltage. The eighth transistor T11 and the twelfth transistor T15 turn on based on the high level voltage of the third node N3, thus the output terminal OUT is held at the low level voltage.

Either the first control signal of the first control terminal FLCA or the second control signal of the second control terminal FLCB is at the high level voltage while the other one is at the low level voltage, and the Nth unit circuit 21 operates under the operation period Pb. The first control signal of the first control terminal FLCA and the second control signal of the second control terminal FLCB are alternately at the high level voltage. In the present embodiment, for example, during the 1st-8th frame periods, the first control signal of the first control terminal FLCA is at the low level voltage, and the second control signal of the second control terminal FLCB is at the high level voltage. During the 9th-16th frame periods, the first control signal of the first control terminal FLCA is at the high level voltage, and the second control signal of the second control terminal FLCB is at the low level voltage.

During the operation Pb, the signal of the set terminal S is at the high level voltage, and the signal of the reset terminal R is at the low level voltage. The Nth unit circuit 21 is thus triggered. The input transistor T1 turns on, and the first node N1 is at the high level voltage. The output transistor T3 turns on, and the output terminal OUT outputs the shifted pulse signal as the scanning signal, which is synchronous with the clock control signal of the clock control terminal CK. The pull-down transistor T2 turns off. The first transistor T4 turns on, and the low level voltage is provided to the gate electrode of the third transistor T6, thus the third transistor T6 turns off. The second transistor T5 turns on based on the high level voltage of the first node N1, thus the second node N2 is at low level voltage. The first switching unit 273 and the second switching unit 275 stop outputting the low level voltage to the first node N1 and the output terminal OUT.

The signal of the set terminal S is at low level voltage, and the signal of the reset terminal R is at high level voltage, and the Nth unit circuit 21 is reset. The input terminal T1 turns off, and the pull-down transistor T2 turns on, thus the first node N1 is at the low level voltage. The output transistor T3, the first transistor T4, and the second transistor T5 turn off. During the 1st-8th frame periods, the fifth transistor T8 and the tenth transistor T13 turn on based on the high level voltage of the second control signal of the second control terminal FLCB, thus the third transistor T6 turns on, and the second node N2 and the fourth node N4 are at the high level voltage. The eleventh transistor T14 and the twelfth transistor T15 turn on, thus the first node N1 and the output terminal OUT are held at the low level voltage. The thirteenth transistor T16 turns on, and the third node N3 is at the low level voltage. The fourth transistor T7, the sixth transistor T9, the seventh transistor T10, the eighth transistor T11, and the ninth transistor T12 of the first switching unit 273 are turned off, thus no voltage is applied to the first switching unit 273 and the third node N3 is at the low level voltage.

During the 9th-16th frame periods, the fourth transistor T7 and the sixth transistor T9 turn on based on the high level voltage of the first control signal of the first control terminal FLCA, the third transistor T6 turns on and the second node N2 and the third node N3 are at the high level voltage. The seventh transistor T10 and the eighth transistor T11 turn on based on the high level voltage of the third node N3, thus the first node N1 and the output terminal OUT are held at the low level voltage. The fifth transistor T8, the tenth transistor T13, the eleventh transistor T14, the twelfth transistor T15, and the thirteenth transistor T16 of the second switching unit 275 turn off, thus no voltage is applied to the second switching unit 275, and the fourth node N4 is at the low level voltage.

Figure 6:
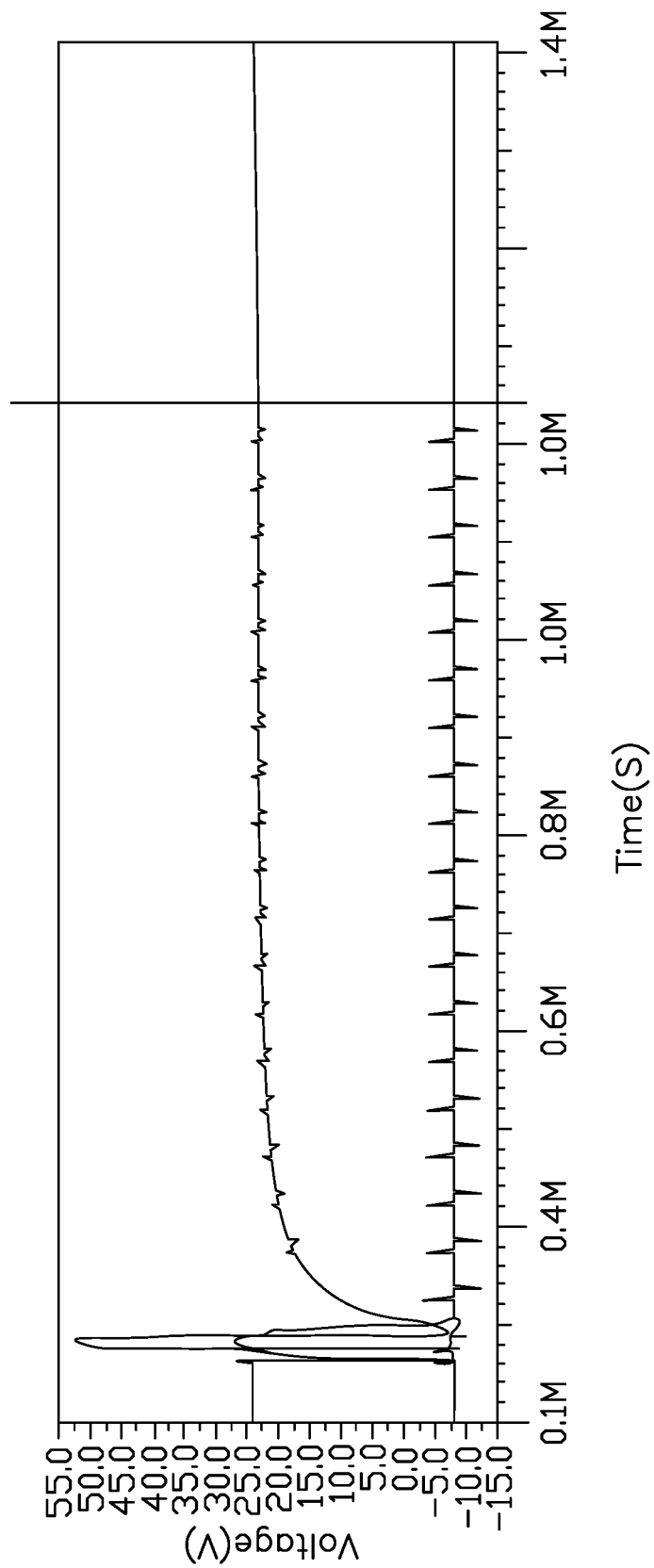
FIG. 6 is a chart showing a waveform of the second node of the unit circuit in FIG. 4.

FIG. 6 illustrates the voltage of the second node N2 of the Nth unit circuit 21. During the initial period Pa, the second node N2 is held at the high level voltage, and there is no coupling effect between the second node N2 and the clock control signal of the clock control lines VCK1-VCK6. During the operation period Pb, the voltage of the second node N2 fluctuates slightly based on the first switching unit 273 and the second switching unit 275, which are respectively controlled by the first control signal of the first control terminal FLCA and the second control signal of the second control terminal FLCB.

Based on this structure of the display apparatus 1, during the initial period Pa, the first control signal of the first control terminal FLCA and the second control signal of the second control terminal FLCB are at the high level voltage, and the clock control signals of the clock control lines VCK1-VCK6 remain as the pulse signals. The time delay of the unit circuit 21 and the turn-on periods of the transistors of the unit circuit 21 are improved, and the performance of the display apparatus 1 is improved.

While various and preferred embodiments have been described the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A gate driver for generating a plurality of shifted pulse signals shifted in a specified phase, the gate driver comprising:
   a plurality of unit circuits connected in a plurality of stages, each unit circuit configured to receive at least one external clock control signal and sequentially operate under an initial period and an operation period; and each unit circuit comprising:

an output terminal electrically connected to at least one external signal line, and configured to provide a shifted pulse signal to the connected corresponding at least one external signal line;

an input transistor configured to output a high level voltage to a first node based on a trigger signal activating the unit circuit;

an output transistor configured to output the shifted pulse signal to the output terminal in response to the high level voltage of the first node, the shifted pulse signal being synchronous with the at least one external clock control signal; a gate electrode of the output transistor connected to the first node, a drain electrode of the output transistor receiving the at least one external clock control signal, and a source electrode of the output transistor connected to the output terminal; and a holding module configured to receive the trigger signal, a first control signal, and a second control signal;

wherein during the initial period, the unit circuit is unable to output the shifted pulse signal; during the operation period, the unit circuit outputs the shifted pulse signal; during the initial period, the trigger signal is at a low level voltage, the first control signal and the second control signal are at same high level voltage, the holding module outputs the low level voltage to the output terminal based on the first control signal and the second control signal;

the holding module comprises a control unit, a first switching unit and a second switching unit the control unit comprises a first input terminal receiving the trigger signal, a second input terminal connected with the first node, a first control terminal receiving the first control signal, a second control terminal receiving the second control signal, and a second node connected with the first switching unit and the second switching unit during the operation period, the second node is at the high level voltage based on the trigger signal at the low level voltage and the first switching unit and the second switching unit alternately output the low level voltage to the output terminal.

2. The gate driver of claim 1, wherein during the operation period, each of the first control signal and the second control signal switches between the low level voltage and the high level voltage, the first control signal and the second control signal are alternately at the high level voltage, and in any point in time, the first control signal and the second control signal are different from each other; when the trigger signal is at the low level voltage, the holding module outputs the low level voltage to the output terminal based on the high level voltage of the first control signal or the second control signal.

3. The gate driver of claim 1, wherein the first switching unit outputs the low level voltage based on the first control signal at the high level voltage; the second switching unit outputs the low level voltage based on the second control signal at the high level voltage.

4. The gate driver of claim 3, wherein the control unit comprises a first transistor, a second transistor, a third transistor, a fourth transistor, and a fifth transistor; a gate electrode of the first transistor receives the trigger signal, a source electrode of the first transistor connects to a low voltage power source, and a drain electrode of the first transistor connects to a source electrode of the third transistor; a gate electrode of the second transistor connects to the first node, a source electrode of the second transistor connects to the low voltage power source, and a drain electrode of the second transistor connects to the second node; a gate electrode of the third transistor connects to the drain electrode of the first transistor, a source electrode of the third transistor connects to the gate electrode of the third transistor, and a drain electrode of the third transistor connects to the second node; a gate electrode of the fourth transistor connects to the first control terminal, a source electrode of the fourth transistor connects to the gate electrode of the fourth transistor, and a drain electrode of the fourth transistor connects to the drain electrode of the first transistor; a gate electrode of the fifth transistor connects to the second control terminal, a source electrode of the fifth transistor connects to the gate electrode of the fifth transistor, and a drain electrode of the fifth transistor connects to the drain electrode of the first transistor.

5. The gate driver of claim 3, wherein the first switching unit comprises a sixth transistor, a seventh transistor, an eighth transistor, and a ninth transistor; a gate electrode of the sixth transistor connects to the first control terminal, a source electrode of the sixth transistor connects to the second node, and a drain electrode of the sixth transistor connects to the gate electrode of the seventh transistor through a third node; a source electrode of the seventh transistor connects to the low voltage power source, and a drain electrode of the seventh transistor connects to the first node; a gate electrode of the eighth transistor connects to the third node, source electrodes of the eighth transistor and the ninth transistor connect to the low voltage power source, a drain electrode of the eighth transistor connects to the output terminal, and a drain electrode of the ninth transistor connects to the second switching unit through a fourth node; a gate electrode of the ninth transistor connects to the first control terminal.

6. The gate driver of claim 1, wherein the second switching unit comprises a tenth transistor, a eleventh transistor, a twelfth transistor, and a thirteenth transistor; a gate electrode of the tenth transistor connects to the second control terminal, a source electrode of the tenth transistor connects to the second node, and a drain electrode of the tenth transistor connects to the gate electrode of the eleventh transistor through a fourth node; a source electrode of the eleventh transistor connects to the low voltage power source, and a drain electrode of the eleventh transistor connects to the first node; a gate electrode of the twelfth transistor connects to the fourth node, source electrodes of the twelfth transistor and the thirteenth transistor connect to the low voltage power source, a drain electrode of the twelfth transistor connects to the output terminal, and a drain electrode of the thirteenth transistor connects to the first switching unit through a third node; a gate of the thirteenth transistor connects to the second control terminal.

7. The gate driver of claim 1, wherein the unit circuit further comprises a pull-down transistor; a gate electrode of the pull-down transistor receives a reset signal, a source electrode of the pull-down transistor is electrically connected to the low voltage power source and a drain electrode of the pull-down transistor is electrically connected to the first node.

8. The gate driver of claim 1, wherein during the operation period, voltages of the first control signal and the second control signal invert in every 8 frame periods.

9. A display apparatus comprising:
a display region;

a non-display region surrounding the display region, and the non-display region comprising:
  at least one gate driver configured to generate a plurality of shifted pulse signals shifted in a specified phase; the at least one gate driver comprising:
  a plurality of unit circuits connected in a plurality of stages, each unit circuit configured to receive at least one external clock control signal and sequentially operate under an initial period and an operation period; and each unit circuit comprising:
    an output terminal, electrically connected to at least one external signal line, and configured to provide a shifted pulse signal to the connected corresponding at least one external signal line;
    an input transistor configured to output a high level voltage to a first node based on a trigger signal activating the unit circuit;
    an output transistor configured to output the shifted pulse signal to the output terminal in responding to the high level voltage of the first node, the shifted pulse signal being synchronous with the at least one external clock control signal; a gate electrode of the output transistor connected to the first node, a drain electrode of the output transistor receiving the at least one external clock control signal, and a source electrode of the output transistor connected to the output terminal; and
    a holding module configured to receive the trigger signal, a first control signal, and a second control signal;
    wherein when the initial period, the trigger signal is at a low level voltage, the first control signal and the second control signal are at same high level voltage, the holding module outputs the low level voltage to the output terminal based on the first control signal and the second control signal;
    the holding module comprises a control unit, a first switching unit, and a second switching unit the control unit comprises a first input terminal receiving the trigger signal, a second input terminal connected with the first node, a first control terminal receiving the first control signal, a second control terminal receiving the second control signal, and a second node connected with the first switching unit and the second switching unit; during the operation period, the second node is at the high level voltage based on the trigger signal at the low level voltage and the first switching unit and the second switching unit alternately output the low level voltage to the output terminal.

10. The display apparatus of claim 9, wherein when the operation period, each of the first control signal and the second control signal switches between the low level voltage and the high level voltage, the first control signal and the second control signal are alternately at the high level voltage, in any point in time, the first control signal and the second control signal are different from each other; during the trigger signal is at the low level voltage, the holding module outputs the low level voltage to the output terminal based on the high level voltage of the first control signal or the second control signal.

11. The display apparatus of claim 9, wherein the first switching unit outputs the low level voltage based on the first control signal at the high level voltage; the second switching unit outputs the low level voltage based on the second control signal at the high level voltage.

12. The gate driver of claim 9, wherein the control unit comprises a first transistor, a second transistor, a third transistor, a fourth transistor, and a fifth transistor; a gate electrode of the first transistor receives the trigger signal, a source electrode of the first transistor connects to a low voltage power source, and a drain electrode of the first transistor connects to a source electrode of the third transistor; a gate electrode of the second transistor connects to the first node, a source electrode of the second transistor connects to the low voltage power source, and a drain electrode of the second transistor connects to the second node; a gate electrode of the third transistor connects to the drain electrode of the first transistor, a source electrode of the third transistor connects to the gate electrode of the third transistor, and a drain electrode of the third transistor connects to the second node; a gate electrode of the fourth transistor connects to the first control terminal, a source electrode of the fourth transistor connects to the gate electrode of the fourth transistor, and a drain electrode of the fourth transistor connects to the drain electrode of the first transistor; a gate electrode of the fifth transistor connects to the second control terminal, a source electrode of the fifth transistor connects to the gate electrode of the fifth transistor, and a drain electrode of the fifth transistor connects to the drain electrode of the first transistor.

13. The gate driver of claim 9, wherein the first switching unit comprises a sixth transistor, a seventh transistor, an eighth transistor, and a ninth transistor; a gate electrode of the sixth transistor connects to the first control terminal, a source electrode of the sixth transistor connects to the second node, and a drain electrode of the sixth transistor connects to the gate electrode of the seventh transistor through a third node; a source electrode of the seventh transistor connects to the low voltage power source, and a drain electrode of the seventh transistor connects to the first node; a gate electrode of the eighth transistor connects to the third node, source electrodes of the eighth transistor and the ninth transistor connect to the low voltage power source, a drain electrode of the eighth transistor connects to the output terminal, and a drain electrode of the ninth transistor connects to the second switching unit through a fourth node; a gate electrode of the ninth transistor connects to the first control terminal.

14. The gate driver of claim 9, wherein the second switching unit comprises a tenth transistor, a eleventh transistor, and a twelfth transistor and a thirteenth transistor; a gate electrode of the tenth transistor connects to the second control terminal, a source electrode of the tenth transistor connects to the second node, and a drain electrode of the tenth transistor connects to the gate electrode of the eleventh transistor through a fourth node; a source electrode of the eleventh transistor connects to the low voltage power source, and a drain electrode of the eleventh transistor connects to the first node; a gate electrode of the twelfth transistor connects to the fourth node, source electrodes of the twelfth transistor and the thirteenth transistor connect to the low voltage power source, a drain electrode of the twelfth transistor connects to the output terminal, and a drain electrode of the thirteenth transistor connects to the first switching unit through a third node; a gate of the thirteenth transistor connects to the second control terminal.

15. The gate driver of claim 9, wherein the unit circuit further comprises a pull-down transistor; a gate electrode of the pull-down transistor receives a reset signal, a source electrode of the pull-down transistor is electrically connected to the low voltage power source and a drain electrode of the pull-down transistor is electrically connected to the first node.

16. The gate driver of claim 9, wherein during the operation period, voltages of the first control signal and the second control signal invert in every 8 frame periods.

* * * * *